(12) United States Patent
Abuelma'atti et al.

(10) Patent No.: US 9,837,986 B2
(45) Date of Patent: Dec. 5, 2017

(54) FLOATING IMMITTANCE EMULATOR

(71) Applicant: KING FAHD UNIVERSITY OF PETROLEUM AND MINERALS, Dhahran (SA)

(72) Inventors: Muhammad Taher Abuelma'atti, Dhahran (SA); Sagar Kumar Dhar, Alberta (CA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 15/337,233

(22) Filed: Oct. 28, 2016

(65) Prior Publication Data
US 2017/0149414 A1 May 25, 2017

Related U.S. Application Data

(62) Division of application No. 14/951,467, filed on Nov. 24, 2015, now Pat. No. 9,548,721.

(51) Int. Cl.
| H03B 1/00 | (2006.01) |
| H03K 5/00 | (2006.01) |
| H04B 1/10 | (2006.01) |
| H03H 11/48 | (2006.01) |
| H03H 11/46 | (2006.01) |

(52) U.S. Cl.
CPC ......... *H03H 11/485* (2013.01); *H03H 11/481* (2013.01); *H03H 11/53* (2013.01)

(58) Field of Classification Search
USPC ........... 333/214, 215; 327/552–555; 330/107
See application file for complete search history.

(56) References Cited

U.S. PATENT DOCUMENTS

| 3,806,832 A | * | 4/1974 | Channing | ............... H03B 5/20 331/108 D |
| 3,824,496 A | * | 7/1974 | Hekimian | ............... H03H 11/42 327/103 |
| 4,191,977 A | * | 3/1980 | Lewkowicz | ........... G11B 5/027 360/66 |
| 4,760,353 A | * | 7/1988 | Perkins | .................... H03B 5/20 331/115 |
| 4,878,244 A | * | 10/1989 | Gawargy | ............... H04B 1/586 379/378 |
| 5,093,642 A | * | 3/1992 | Mittel | .................... H03H 11/50 333/215 |

(Continued)

OTHER PUBLICATIONS

Alpaslan et al., "Inverting CFOA Based Lossless and Lossy Grounded Inductor Simulators," Circuits, Systems, and Signal Processing, Feb. 2015.

(Continued)

*Primary Examiner* — Adam Houston
(74) *Attorney, Agent, or Firm* — Oblon, McClelland, Maier & Neustadt, L.L.P.

(57) ABSTRACT

The floating immittance emulator is presented in four embodiments in which four new topologies for emulating floating immittance functions are detailed. Each circuit uses three current-feedback operational-amplifiers (CFOAs) and three passive elements. The present topologies can emulate lossless and lossy floating inductances; capacitance, resistance, and inductance multipliers; and frequency-dependent positive and negative resistances.

3 Claims, 16 Drawing Sheets

(56) References Cited

U.S. PATENT DOCUMENTS

| | | | | |
|---|---|---|---|---|
| 5,467,400 | A | * | 11/1995 | Keir .................. G10H 1/16 |
| | | | | 381/61 |
| 5,585,741 | A | | 12/1996 | Jordan |
| 5,825,265 | A | * | 10/1998 | Fujii .................. H03H 11/50 |
| | | | | 333/215 |
| 6,194,972 | B1 | * | 2/2001 | Brown .................. H03B 5/20 |
| | | | | 330/252 |
| 6,646,463 | B1 | | 11/2003 | Hariton |
| 8,264,289 | B2 | * | 9/2012 | Chang .................. H03B 27/00 |
| | | | | 331/108 B |
| 9,019,030 | B1 | * | 4/2015 | Abuelma'atti ........ H04L 27/122 |
| | | | | 331/45 |
| 9,548,721 | B1 | * | 1/2017 | Abuelma'atti ..... H03H 11/1217 |
| 2001/0001759 | A1 | * | 5/2001 | Holden ............. H03H 11/0422 |
| | | | | 455/266 |
| 2009/0033440 | A1 | * | 2/2009 | Masuda ................. H03H 11/42 |
| | | | | 333/215 |
| 2009/0123003 | A1 | * | 5/2009 | Sibbald ............... G10K 11/178 |
| | | | | 381/71.14 |
| 2009/0212788 | A1 | * | 8/2009 | Patterson ........... G01N 15/1031 |
| | | | | 324/601 |
| 2013/0021097 | A1 | * | 1/2013 | Adams ................... H03F 1/083 |
| | | | | 330/252 |
| 2016/0378896 | A1 | * | 12/2016 | Abuelma'atti .......... G06F 17/10 |
| | | | | 703/2 |
| 2017/0085367 | A1 | * | 3/2017 | Fernandez ................ G06F 1/04 |

OTHER PUBLICATIONS

Kacari et al., "CFOA-Based Lossless and Lossy Inductance Simulators," Radioengineering, vol. 20, No. 3, Sep. 2011.

* cited by examiner

US 9,837,986 B2

FLOATING IMMITTANCE EMULATOR

CROSS-REFERENCE TO RELATED APPLICATION

This application is a divisional of U.S. patent application Ser. No. 14/951,467, filed Nov. 24, 2015, now pending.

BACKGROUND OF THE INVENTION

1. Field of the Invention

The present invention relates to emulator circuits, particularly to floating immittance emulator circuits that use three current-feedback operational amplifiers (CFOAs).

2. Description of the Related Art

Over the years researchers have reported several floating inductance simulators using a wide range of active elements. This is attributed to its importance in designing many analog signal processing circuits, such as impedance matching circuits, low frequency filters, and oscillators, where relatively large values of inductance that cannot be fabricated on the chip are required. Of particular interest are realizations based on the use of the CFOA as an active element. This is attributed to the unique characteristics of the CFOA, such as the relatively wider operating bandwidth (there is no gain-bandwidth limitation), its relatively high slew rate, and its commercial availability. Obviously, the use of the minimum number of CFOAs is preferable, as it implies less power consumption and less area on the chip.

Thus, a floating immittance emulator solving the aforementioned problems is desired.

SUMMARY OF THE INVENTION

The floating immittance emulator is presented in various circuits for emulating immittance (impedance or admittance [ratio of current to voltage]; immittance is a term embracing both). Each circuit uses three current-feedback operational-amplifiers (CFOAs), and passive elements. The present topologies can emulate lossless and lossy floating inductances, and capacitance, resistance and inductance multipliers, in addition to frequency-dependent positive and negative resistances. The functionality of the present circuits is verified using Advanced Design System (ADS) software and the AD844 CFOA. The simulation results are in excellent agreement with the theoretical calculations.

These and other features of the present invention will become readily apparent upon further review of the following specification and drawings.

DETAILED DESCRIPTION OF THE PREFERRED EMBODIMENTS

As shown in FIGS. 1A, 1B, 1C and 1D, the three-CFOA-based floating immittance emulator includes inductance simulators using three CFOAs. Regarding references to the y, x, z, and w-terminals of the CFOAs, it will be understood that as used herein, the y- and x-terminals are input terminals of a CFOA building block and z- and w-output terminals of the CFOA comprise the z-output terminal (the slewing node of the Analog Devices AD844) and w-output terminal, respectively, of the CFOA.

Figure 1A:
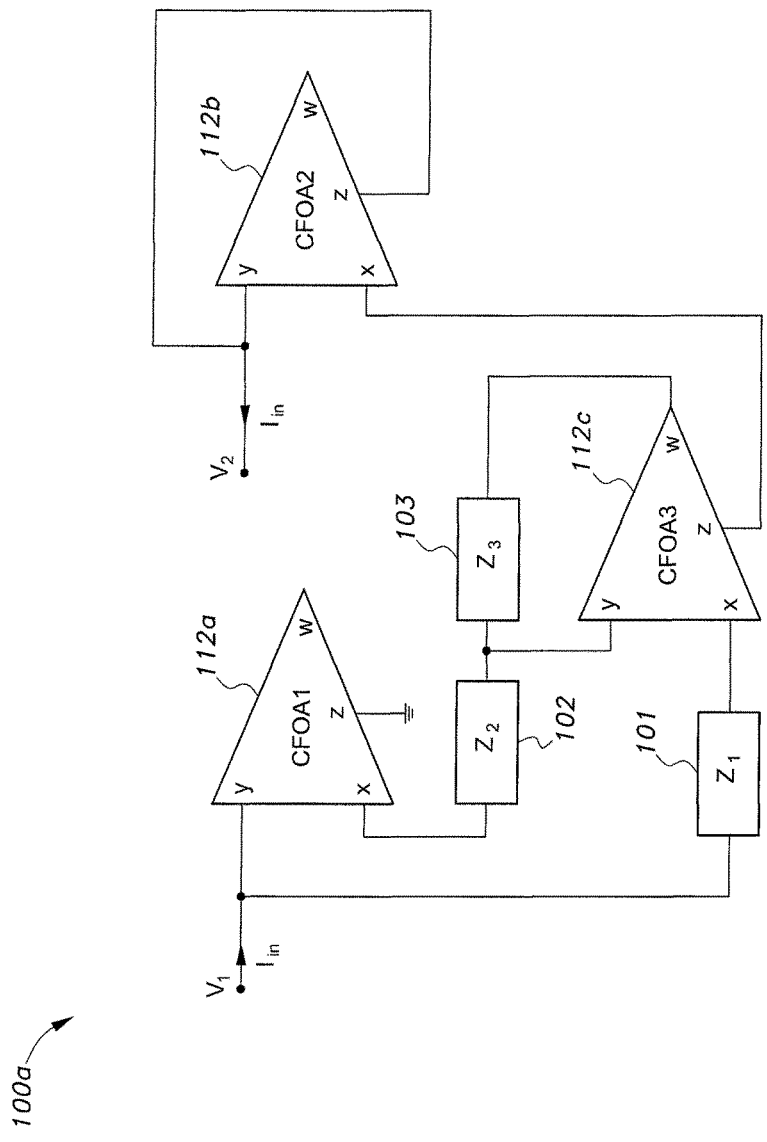
FIG. 1A is a schematic diagram of a first embodiment of a floating immittance emulator according to the present invention.

The immittance emulator circuit 100a shown in FIG. 1A includes a first CFOA 112a having first y-, x-, z-, and w-terminals, first z-terminal being connected to ground. A second CFOA 112b having second y-, x-, z-, and w-terminals, the second z-terminal being connected to the second y-terminal. A third CFOA 112c having third y-, x-, z-, and w-terminals, the third z-terminal being connected to the second x-terminal of the second CFOA. A first impedance 101 has a first lead connected to the first y-terminal of the first CFOA 112a and a second lead connected to the third x-terminal of the third CFOA 112c. A second impedance 102 having a first lead connected to the first x-terminal of first CFOA 112a and a second lead connected to the third y-terminal of third CFOA 112c. A third impedance 103 having a first lead connected to the third y-terminal of third CFOA 112c and a second lead connected to the third w-terminal of third CFOA 112c. This circuit performs immittance emulation between a voltage $v_1$ applied to the first y-terminal of the first CFOA 112a and a voltage $v_2$ applied to the second y-terminal of the second CFOA 112b.

Figure 1B:
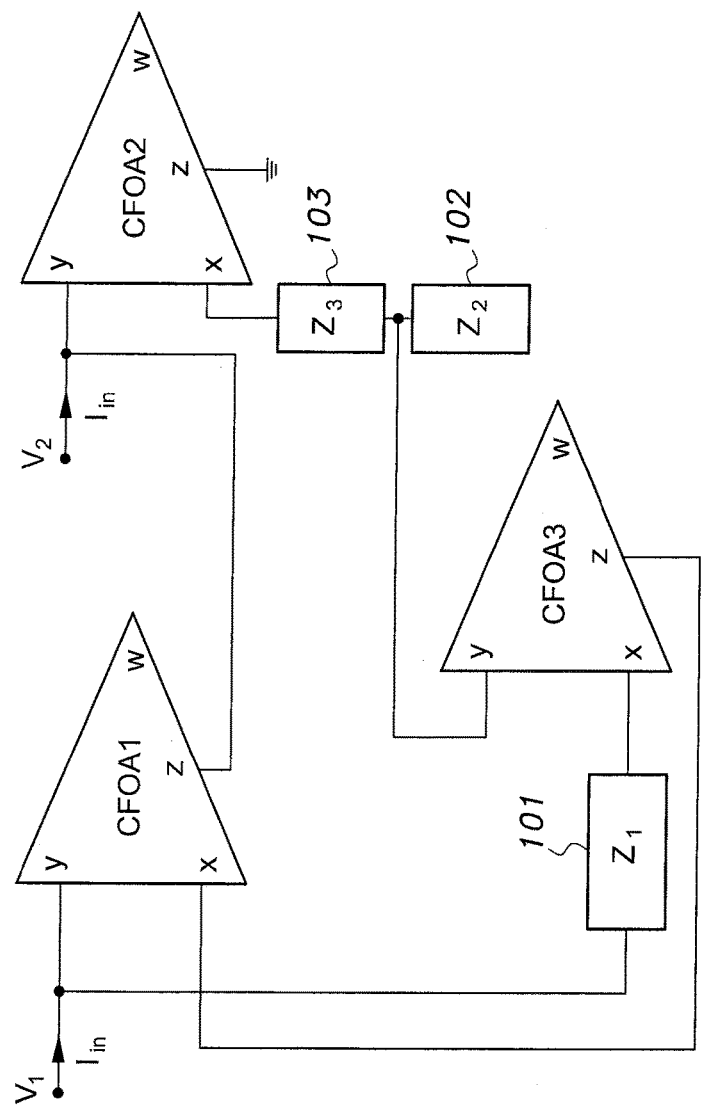
FIG. 1B is a schematic diagram of a second embodiment of a floating immittance emulator according to the present invention.

The immittance emulator circuit 100b shown in FIG. 1B includes a first CFOA 112a having first y-, x-, z-, and w-terminals. A second CFOA 112b having second y-, x-, z-, and w-terminals. A third CFOA 112c having third y-, x-, z-, and w-terminals, the third z-terminal being connected to the first x-terminal of the first CFOA 112a. A first impedance 101 has a first lead connected to the first y-terminal of first CFOA 112a and a second lead connected to the third x-terminal of third CFOA 112c. A second impedance 102 has a first lead connected to the third w-terminal of third CFOA 112c and a second lead connected to the third y-terminal of third CFOA 112c. A third impedance 103 has a first lead connected to the third y-terminal of third CFOA 112c and a second lead connected to the second x-terminal of second CFOA 112b. The second z-terminal of the second CFOA 112b is connected to ground. The second y-terminal of the second CFOA 112b is connected to first z-terminal of CFOA 112a. This circuit performs immittance emulation between a voltage $v_1$ applied to the first y-terminal of the first CFOA 112a and a voltage $v_2$ applied to the second y-terminal of the second CFOA 112b.

Figure 1C:
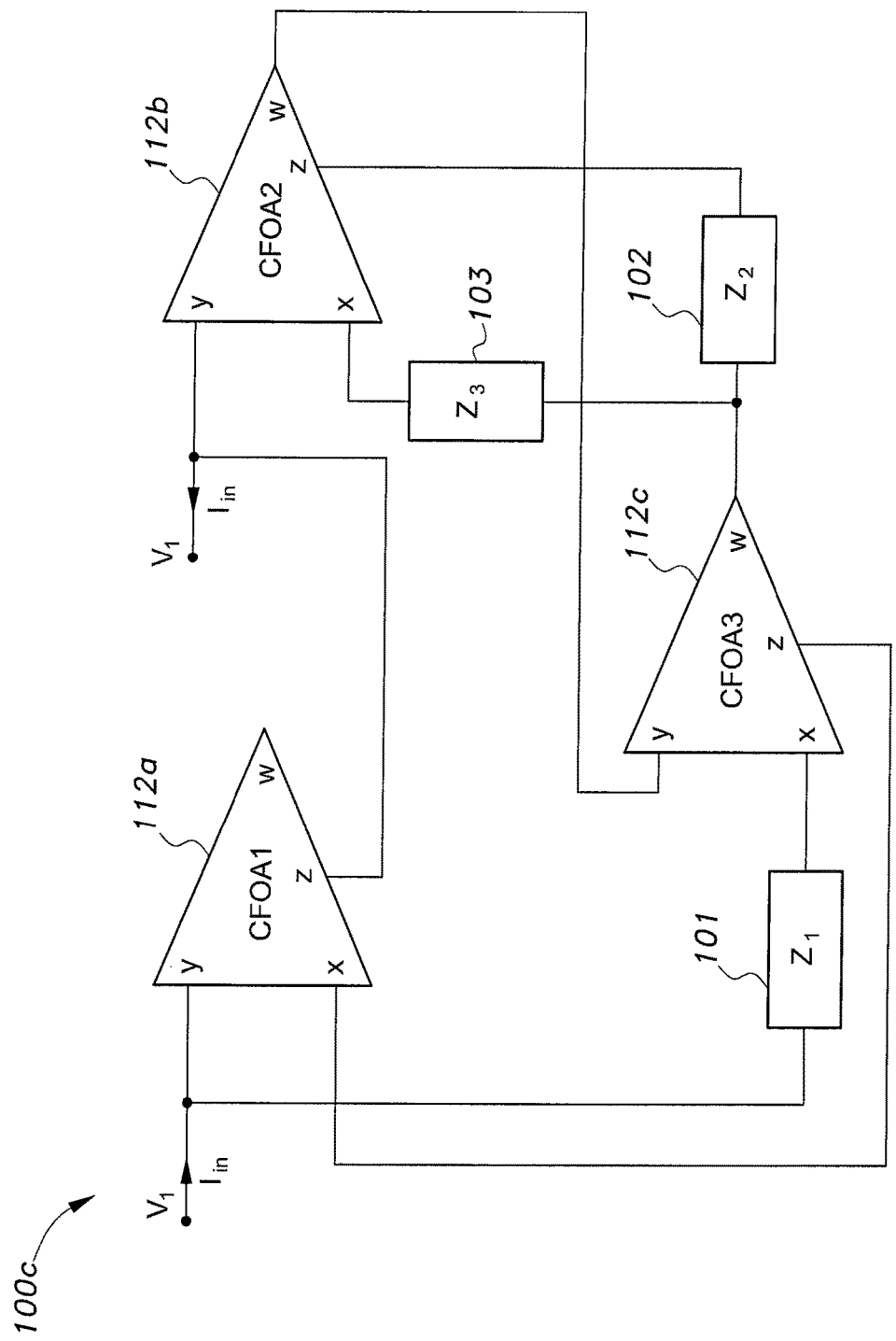
FIG. 1C is a schematic diagram of a third embodiment of a floating immittance emulator according to the present invention.

The immittance emulator circuit 100c shown in FIG. 1C includes a first CFOA 112a having first y-, x-, z-, and w-terminals. A second CFOA 112b has second y-, x-, z-, and w-terminals. A third CFOA 112c has third y-, x-, z-, and w-terminals, the third z-terminal being connected to the first x-terminal of the first CFOA 112a, the third y-terminal being connected to the second w-terminal of CFOA 112b. A first impedance 101 has a first lead connected to the first y-terminal of the first CFOA 112a and a second lead connected to the third x-terminal of the third CFOA 112c. A second impedance 102 has a first lead connected to the third w-terminal of the third CFOA 112c and a second lead connected to the second z-terminal of the second CFOA 112b. A third impedance 103 has a first lead connected to the third w-terminal of the third CFOA 112c and a second lead connected to the second x-terminal of the second CFOA 112b. The second y-terminal of the second CFOA 112b is connected to the first z-terminal of CFOA 112a. This circuit performs immittance emulation between a voltage $v_1$ applied to the first y-terminal of the first CFOA 112a and a voltage $v_2$ applied to the second y-terminal of the second CFOA 112b.

Figure 1D:
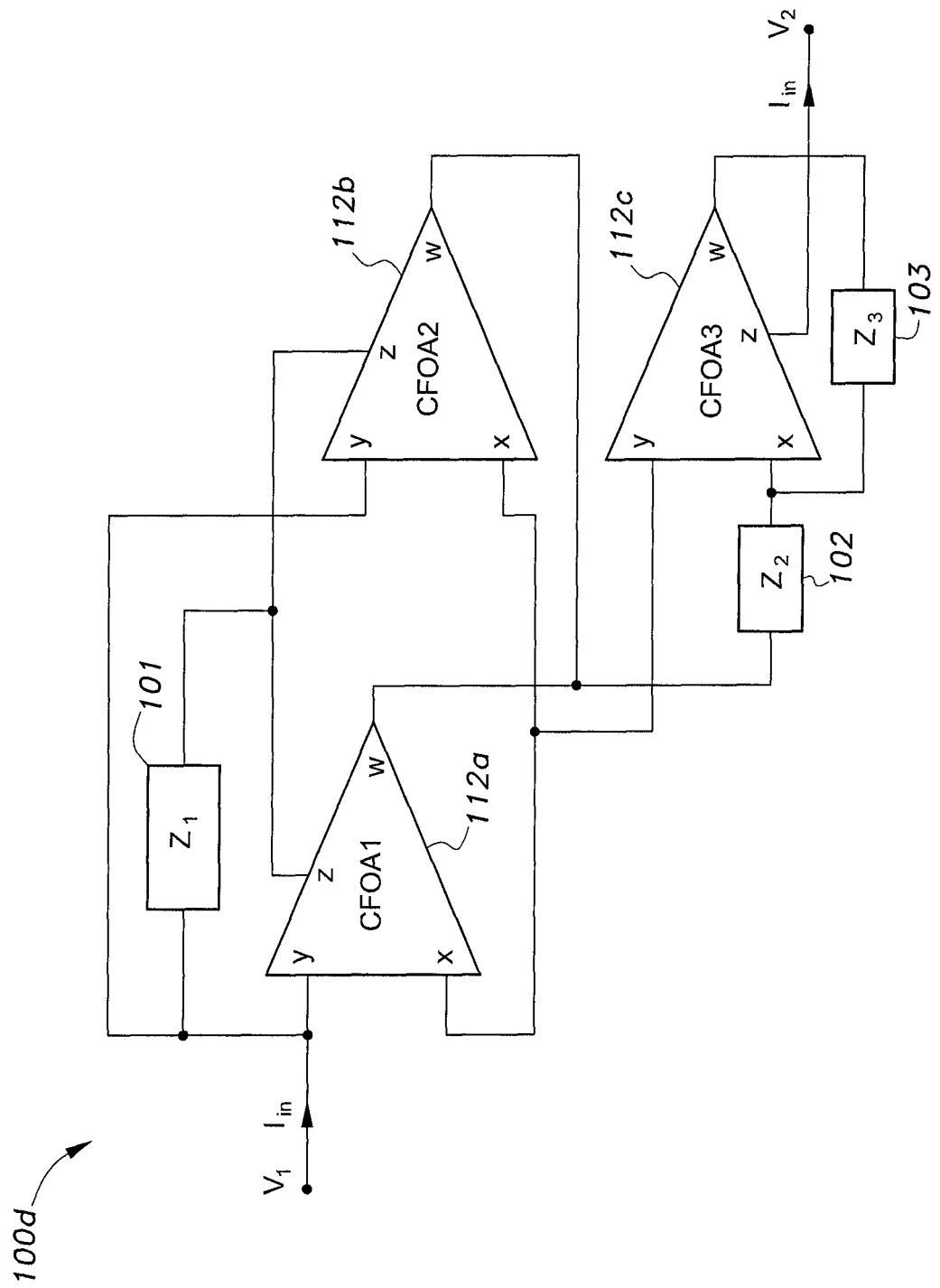
FIG. 1D is a schematic diagram of a fourth embodiment of a floating immittance emulator according to the present invention.

The immittance emulator circuit 100d shown in FIG. 1D includes a first CFOA 112a having first y-, x-, z-, and w-terminals. A second CFOA 112b has second y-, x-, z-, and w-terminals. A third CFOA 112c has third y-, x-, z-, and w-terminals, the third x-terminal being connected to the first x-terminal of the first CFOA 112a and the second x-terminal of the second CFOA 112b. A first impedance 101 has a first lead connected to the first y-terminal of the first CFOA 112a and a second lead connected to the first z-terminal of the first CFOA 112a and the second z-terminal of the second CFOA 112b. A second impedance 102 has a first lead connected to the first w-terminal of the first CFOA 112a and a second lead connected to the third y-terminal of the third CFOA 112c. A third impedance 103 has a first lead connected to the third y-terminal of the third CFOA 112c and a second lead connected to the third w-terminal of the third CFOA 112c. The second y-terminal of the second CFOA 112b is connected to first y-terminal of CFOA 112a. The second w-terminal of the second CFOA 112b is connected to the first w-terminal of CFOA 112a. This circuit performs immittance emulation between a voltage $v_1$ applied to the first y-terminal of the first CFOA 112a and a voltage $v_2$ applied to the third z-terminal of the third CFOA 112c.

Assuming that the CFOAs are characterized by $v_y=v_x$, $i_z=i_x$, $v_w=v_z$, $i_y=0$, routine analysis shows that the input impedance between terminals 1 and 2 of FIGS. 1A-1D is given by $$Z_{in} = \frac{V_1 - V_2}{I_{in}} = Z_1 + \frac{Z_1 Z_3}{Z_2}, \quad (1)$$

for the circuits of FIGS. 1A and 1B, $$Z_{in} = \frac{V_1 - V_2}{I_{in}} = \frac{Z_1 Z_3}{Z_2}, \quad (2)$$

for the circuit of FIG. 1C, and $$Z_{in} = \frac{V_1 - V_2}{I_{in}} = -\frac{Z_1 Z_3}{Z_2}, \quad (3)$$

for the circuit of FIG. 1D.

Thus, with $$Z_1 = R_1, Z_2 = \frac{1}{sC_2},$$

$Z_3=R_3$, then the circuits of FIGS. 1A and 1B can simulate a lossy inductance with a series connected resistance with $R_{eq}=R_1$, $L_{eq}=C_2R_1R_3$, the circuit of FIG. 1C can simulate a positive lossless inductance with $L_{eq}=C_2R_1R_3$, and the circuit of FIG. 1D can simulate a lossless negative inductance with $L_{eq}=-C_2R_1R_3$. Moreover, with $$Z_1 = \frac{1}{sC_1}, Z_3 = \frac{1}{sC_3}$$

and, $Z_2=R_2$ the circuit of FIG. 1C can simulate a positive frequency dependent resistance given by:

$$R_{eq} = \frac{1}{\omega^2 C_1 C_3 R_2}$$

and the circuit of FIG. 1D can simulate a negative frequency dependent resistance given by:

$$R_{eq} = \frac{-1}{\omega^2 C_1 C_3 R_2}.$$

Furthermore, with $Z_1=R_1$, $Z_3=R_3$ and $Z_2=R_2$, the circuit of FIG. 1C realizes a positive resistance multiplier given by:

$$R_{eq} = \frac{R_1 R_3}{R_2}$$

and the circuit of FIG. 1D can simulate a negative resistance multiplier given by:

$$R_{eq} = -\frac{R_1 R_3}{R_2}.$$

Finally, with $Z_1=R_1$, $Z_2=R_2$ and $$Z_3 = \frac{1}{sC_3},$$

the circuit of FIG. 1C can simulate a positive capacitance multiplier with:

$$C_{eq} = \frac{R_2 C_3}{R_1}$$

and the circuit of FIG. 1D can simulate a negative capacitance multiplier with:

$$C_{eq} = -\frac{R_2 C_3}{R_1}.$$

The proposed circuits of FIGS. 1A, 1B, 1C and 1D were simulated using the CFOA specified as Analog Devices AD844 with DC supply voltages=±5.0V. The proposed lossy floating positive inductor obtainable from FIG. 1A was used in the test bench circuit of FIG. 2 with $Z_i$ formed of a capacitance $C_i$=1.0 μF and the resistance $R_o$=2.5 kΩ, and the values of the components in FIG. 1A selected as $R_1$=1.0 kΩ, $C_2$=1.0 μF and $R_3$ as a variable resistor in the range 1.0 kΩ-50.0 kΩ. The output voltage across the resistance $R_o$ was monitored, and the results obtained are shown in FIG. 3. Inspection of FIG. 3 shows that the circuit behaves as a bandpass filter with variable Q and center frequency. Calculations using the simulation results show that the emulated inductance has a loss equivalent to 1.07 kΩ, which agrees well with the theoretical calculation of 1.0 kΩ loss. Moreover, inspection of FIG. 3 shows that the center frequency varies between 21.0 Hz and 151.0 Hz. This is in excellent agreement with the calculations showing that the center frequency changes from 22.5 to 159.0 Hz. This confirms that the circuit of FIG. 1A emulates a lossy positive floating inductance.

Figure 2:
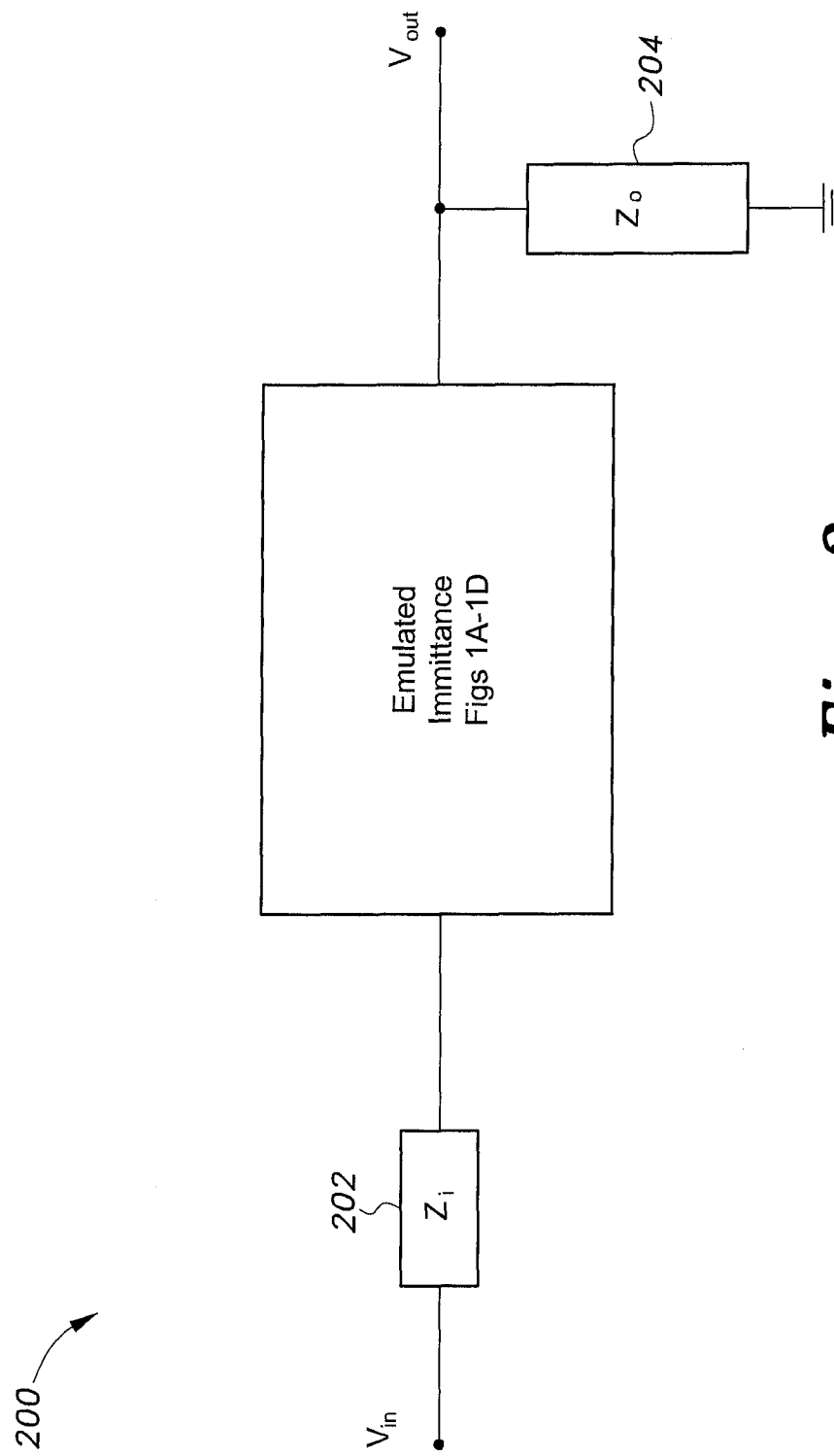
FIG. 2 is a block diagram of a test circuit for the floating immittance emulators of FIGS. 1A-1D.
Figure 3:
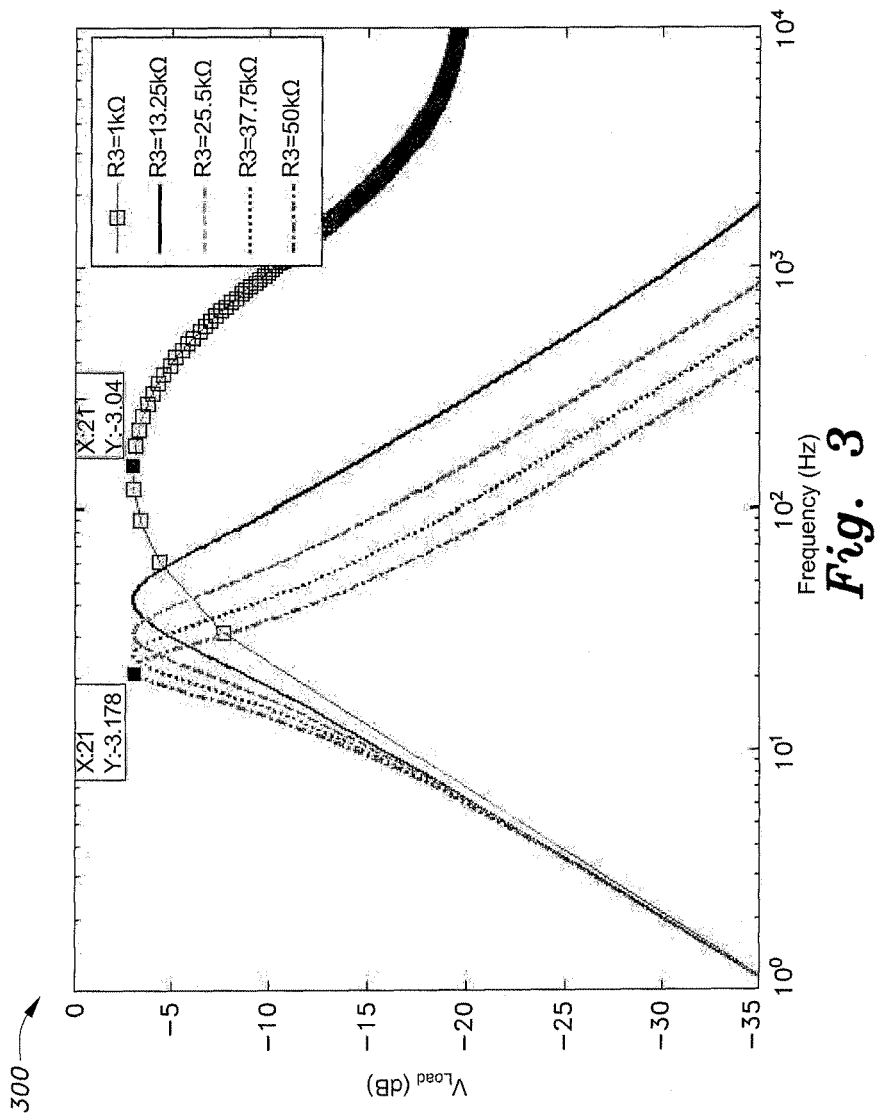
FIG. 3 is a plot showing the transfer function of a bandpass filter obtained using the inductance emulator of FIG. 1A
Figure 4:
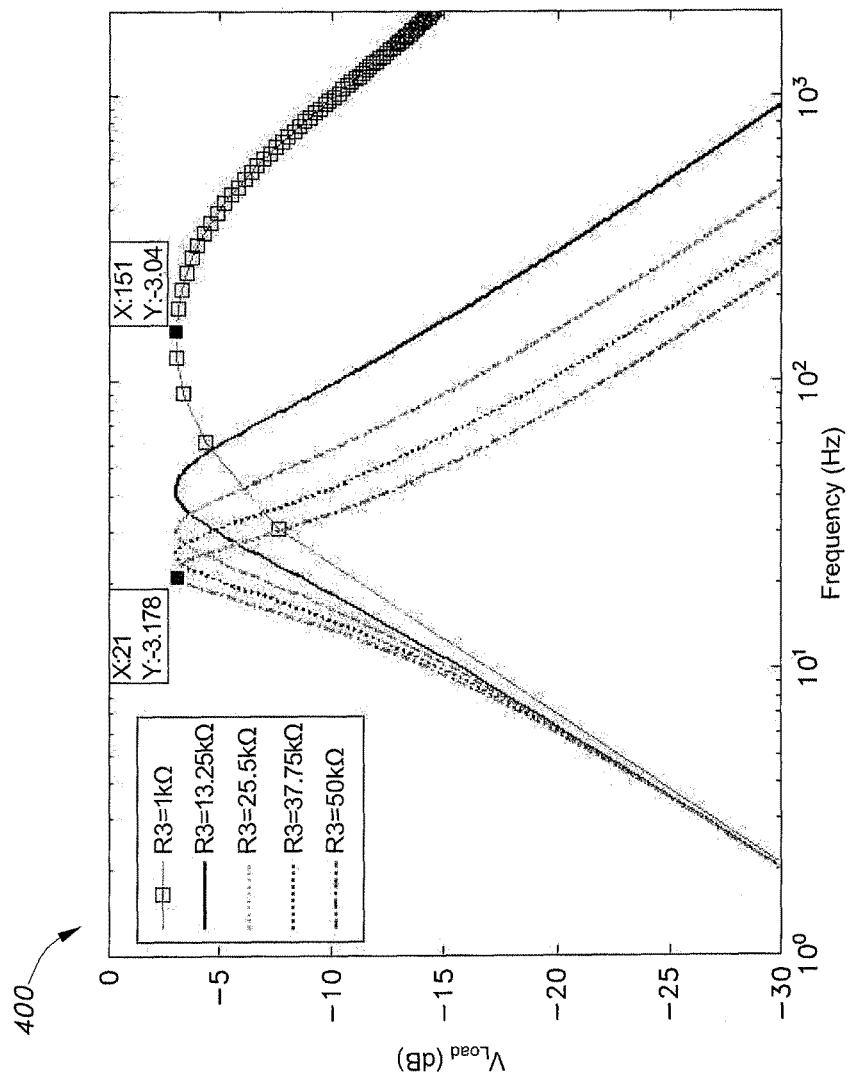
FIG. 4 is a plot showing the transfer function of a bandpass filter obtained using the inductance emulator of FIG. 1B

The proposed lossy floating positive inductor obtainable from FIG. 1B was used in the test bench circuit 200 of FIG. 2 with external impedance $Z_i$ formed of a capacitance $C_i$=1.0 μF and the resistance $R_o$=2.5 kΩ, and the values of the components in FIG. 1B selected as $R_1$=1.0 kΩ, $C_2$=1.0 μF and $R_3$ variable in the range 1.0 kΩ-50.0 kΩ. The output voltage across the resistance $R_o$ was monitored, and the results obtained are shown in FIG. 4. Inspection of FIG. 4 shows that the circuit behaves as a bandpass filter with variable Q and center frequency. This confirms that the circuit of FIG. 1A simulates a lossy positive floating inductance. The simulation results show that the center frequency changes from 22.5 Hz to 159.0 Hz. This is in excellent agreement with the calculations showing that the center frequency changes between 21.0 Hz and 151.0 Hz.

Figure 5:
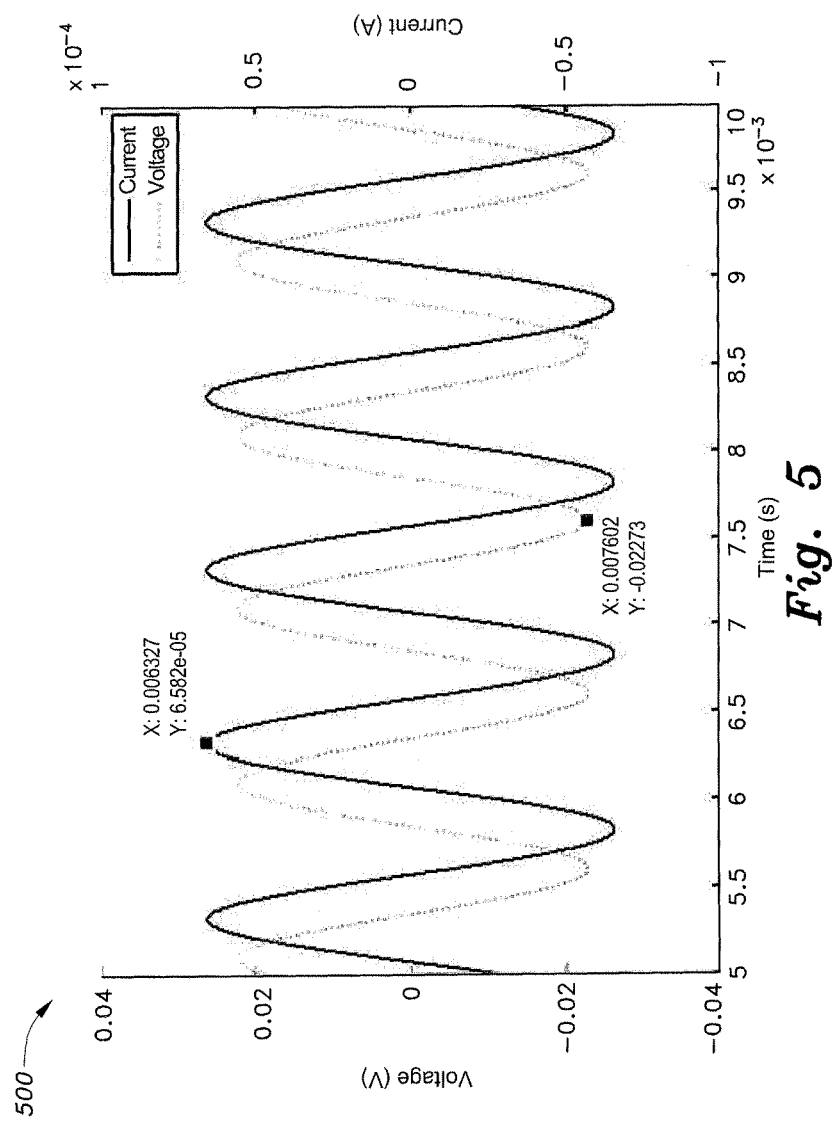
FIG. 5 is a plot showing waveforms of the current through and the voltage across an inductance emulated using FIG. 1C
Figure 6:
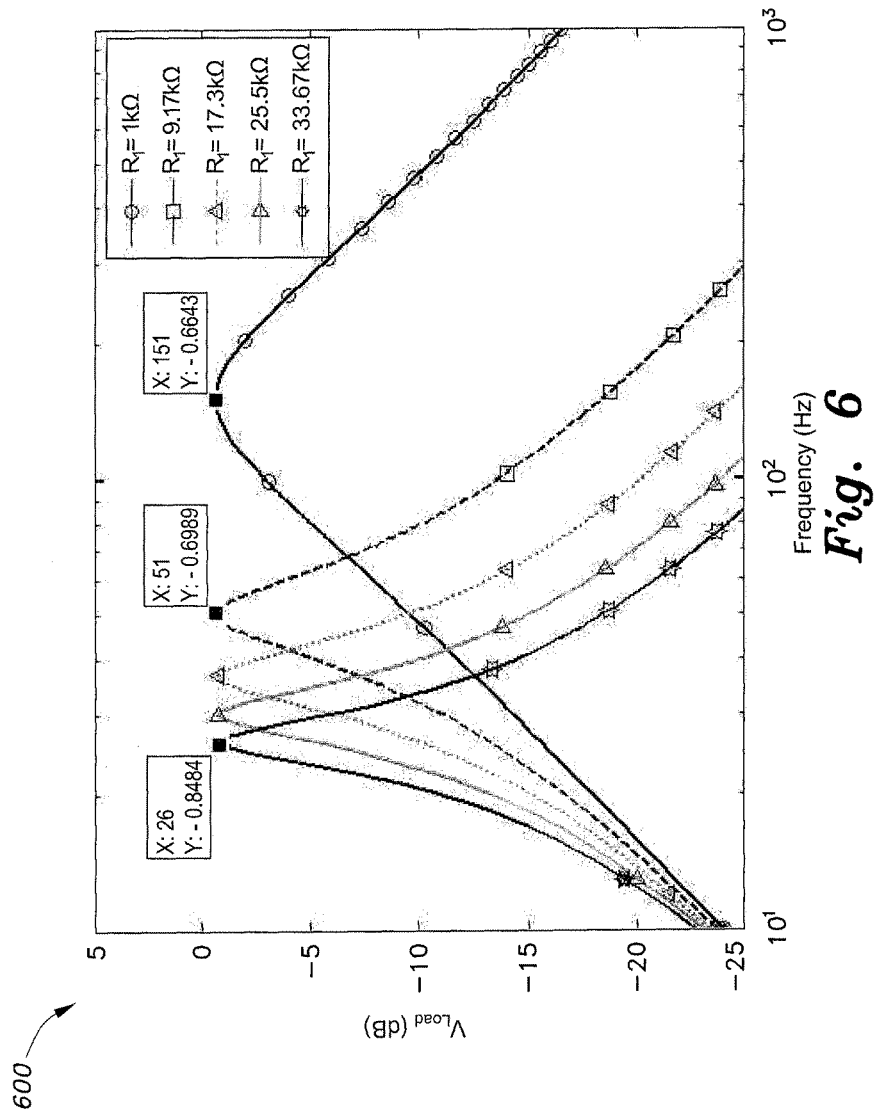
FIG. 6 is a plot showing the transfer function of a bandpass filter obtained using the immittance emulator of FIG. 1C

The proposed lossless floating positive inductor obtainable from FIG. 1C was used in the test bench circuit of FIG. 2 with $Z_i$ formed of a resistance $R_i$=314Ω and the resistance $R_o$=314Ω, and the values of the components in FIG. 1C selected as $R_1$=1.0 kΩ, $C_2$=50.0 nF and $R_3$=1.0 kΩ. The current through the emulated inductance and the voltage across it were monitored, and the results obtained are shown in plot 500 of FIG. 5. Inspection of FIG. 5 shows that the current through the emulated inductance lags by 90° behind the voltage across it. The proposed lossless floating positive inductor obtainable from FIG. 1C was also used in the test bench circuit 200 of FIG. 2 with $Z_i$ formed of a capacitance $C_i$=1.0 μF and resistance $R_o$=1.0 kΩ, and the values of the components in FIG. 1C selected as $C_2$=1.0 μF, $R_3$=1.0 kΩ, and $R_1$ as a variable in the range 1.0 kΩ-50.0 kΩ. The voltage across the resistance $R_o$ was monitored, and the results obtained are shown in plot 600 of FIG. 6. Inspection of FIG. 6 shows that the circuit behaves as a bandpass filter with variable Q and center frequency. This confirms that the circuit of FIG. 1C emulates a lossy positive floating inductance. The simulation results show that the center frequency changes from 22.0 Hz to 151.0 Hz. This is in excellent agreement with the calculations showing that the center frequency changes between 22.5 Hz and 159.0 Hz.

Figure 7:
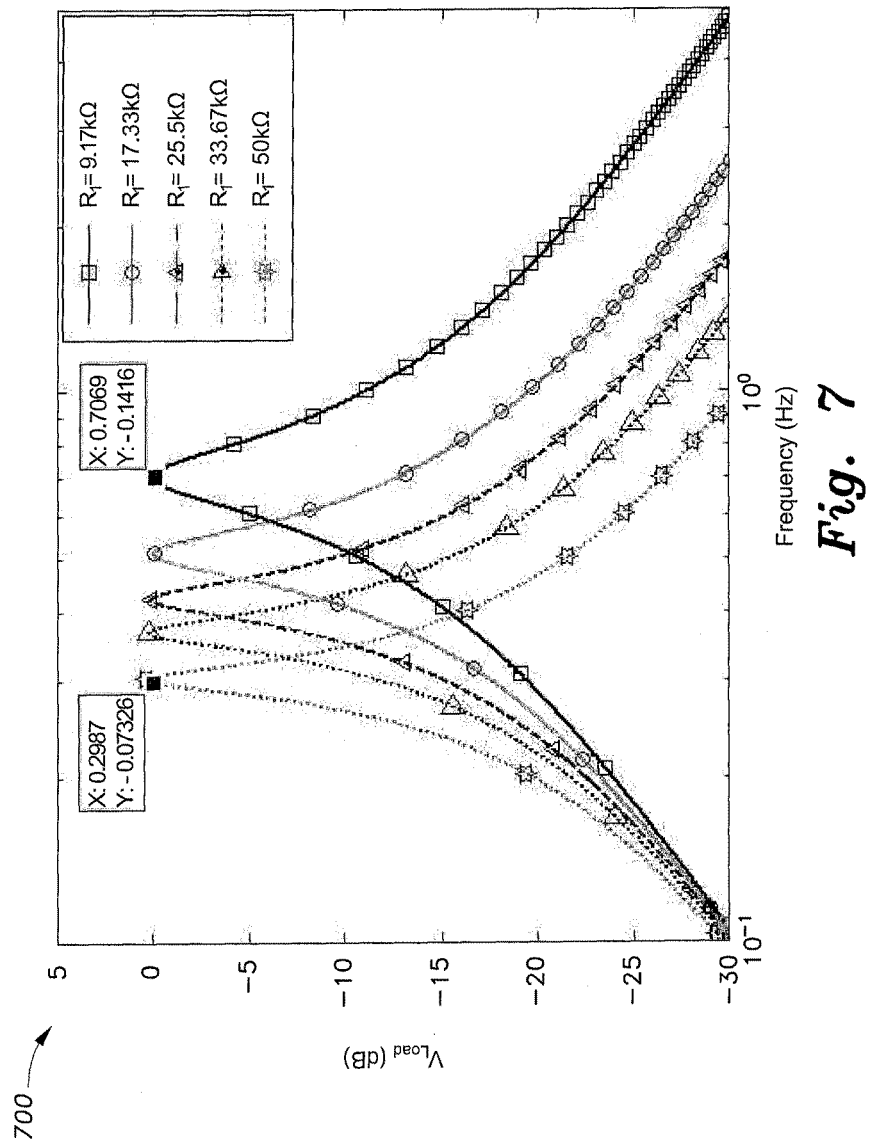
FIG. 7 is a plot showing the transfer function of another bandpass filter obtained using the immittance emulator of FIG. 1C

With the values of the components in FIG. 1C selected as $C_2$=47.0 μF, $R_3$=25.0 kΩ, and $R_1$ as a variable in the range 9.17 kΩ-50.0 kΩ, the proposed emulated positive inductor was tested using the test bench circuit of FIG. 2 with $C_i$=4.7 μF and resistance $R_o$=1.0 kΩ, and the voltage across the resistance $R_o$ was monitored. The results obtained are shown in plot 700 of FIG. 7. Inspection of FIG. 7 shows that the circuit behaves as a bandpass filter with variable Q and center frequency. The simulation results show that the center frequency changes in the range 0.303 Hz-0.7075 Hz. This is in excellent agreement with the calculations showing that the center frequency changes in the range 0.3030 Hz-0.7076 Hz. This confirms that the circuit of FIG. 1C emulates a lossy positive floating inductance and can be used in designing bandpass filters with center frequencies in the sub-Hz region.

Figure 8:
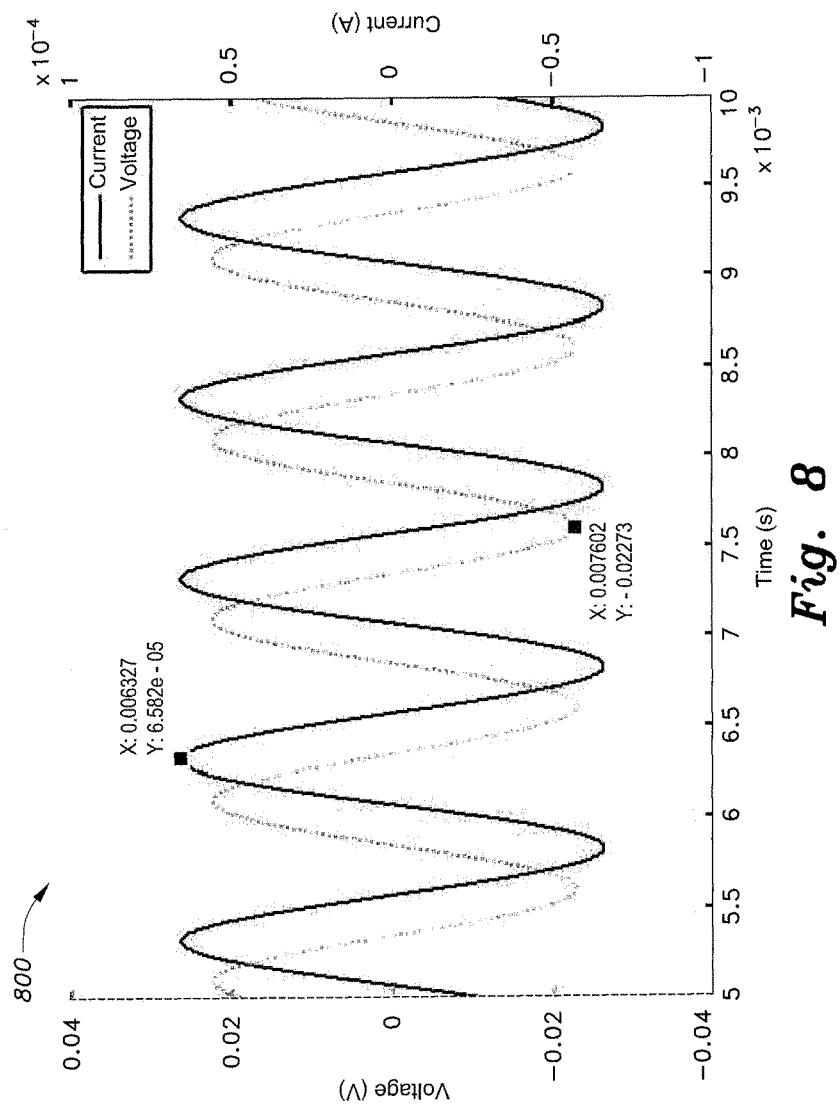
FIG. 8 is a plot showing waveforms of the current through and the voltage across a capacitance emulated using the immittance emulator of FIG. 1C
Figure 9:
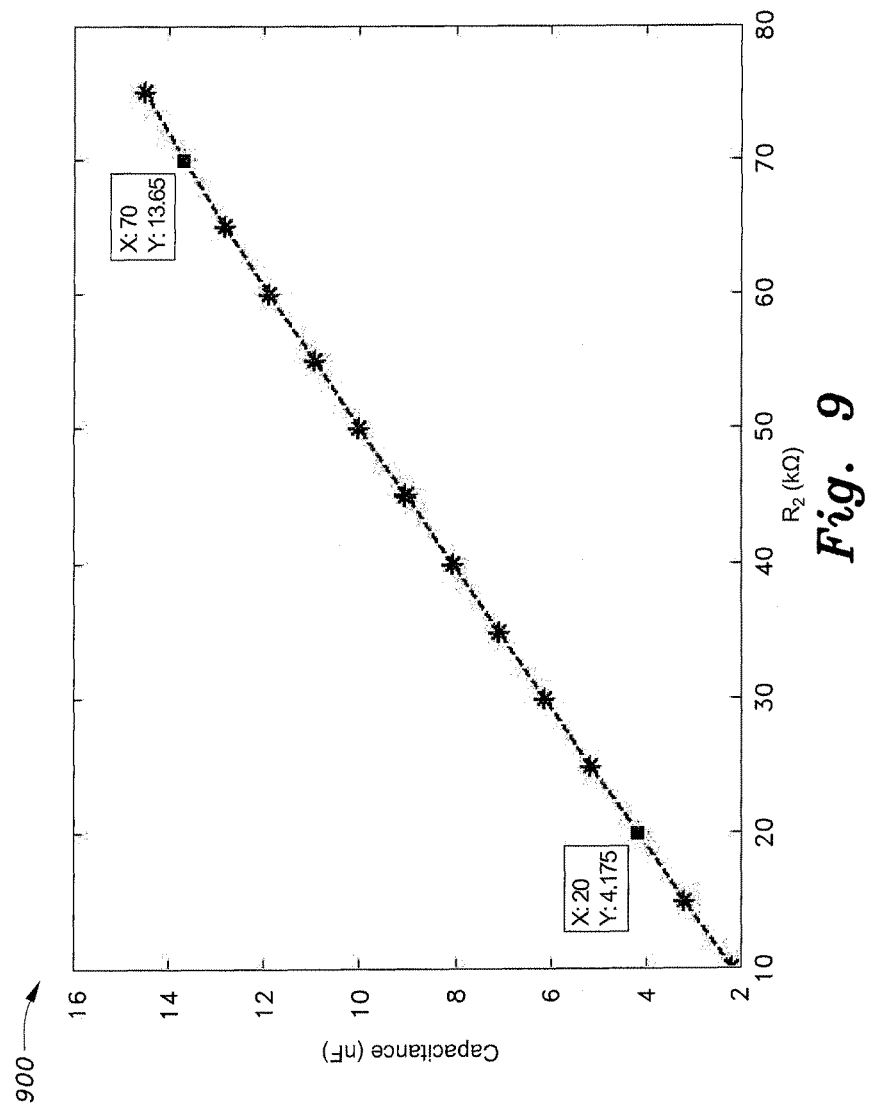
FIG. 9 is a plot showing variation of the capacitance obtained using a capacitance multiplier emulated using the immittance emulator of FIG. 1C

The proposed lossless floating positive capacitance obtainable from FIG. 1C was used in the test bench circuit of FIG. 2 with $Z_i$ and $Z_o$ formed of resistances $R_i$=$R_o$=1.0 kΩ and the values of the components in FIG. 1C selected as $C_1$=1.0 μF, $R_2$=10.0 kΩ, and $R_3$=1.0 kΩ. The voltage across the emulated capacitor and the current through it were monitored, and the results are shown in plot 800 of FIG. 8, where the current is leading the voltage by 90°. This confirms that the circuit 100c of FIG. 1C emulates a lossless positive capacitance. The proposed circuit 100c of FIG. 1C was also tested as a capacitance multiplier by connecting it in the test bench circuit 200 of FIG. 2 with first external impedance 202 $Z_i$ and $Z_o$ (second external impedance 204) formed of resistances $R_i$=$R_o$=1.0 kΩ, and the values of the components of circuit 100c in FIG. 1C selected as $C_1$=1.0 nF, $R_3$=5.0 kΩ, and $R_2$ as a variable in the range 10.0 kΩ-65.0 kΩ. The value of the emulated capacitance was monitored, and the results are shown in plot 900 of FIG. 9. Inspection of plot 900 of FIG. 9 clearly shows that with $R_2$=20.0 kΩ, the circuit 100c of FIG. 1C emulates a capacitance=4.175 nF, while the calculated value is C=4.0 nF, and with $R_2$=70.0 kΩ, the circuit emulates a capacitance=13.65 nF, while the calculated value is 14.0 nF. Thus, a capacitance multiplication by a factor of 15.0 can be achieved. However, the multiplication factor is not linearly increasing with the value of $R_2$ for values of $R_2$>70.0 kΩ. This may be attributed to the nonidealities of the CFOAs.

Figure 10:
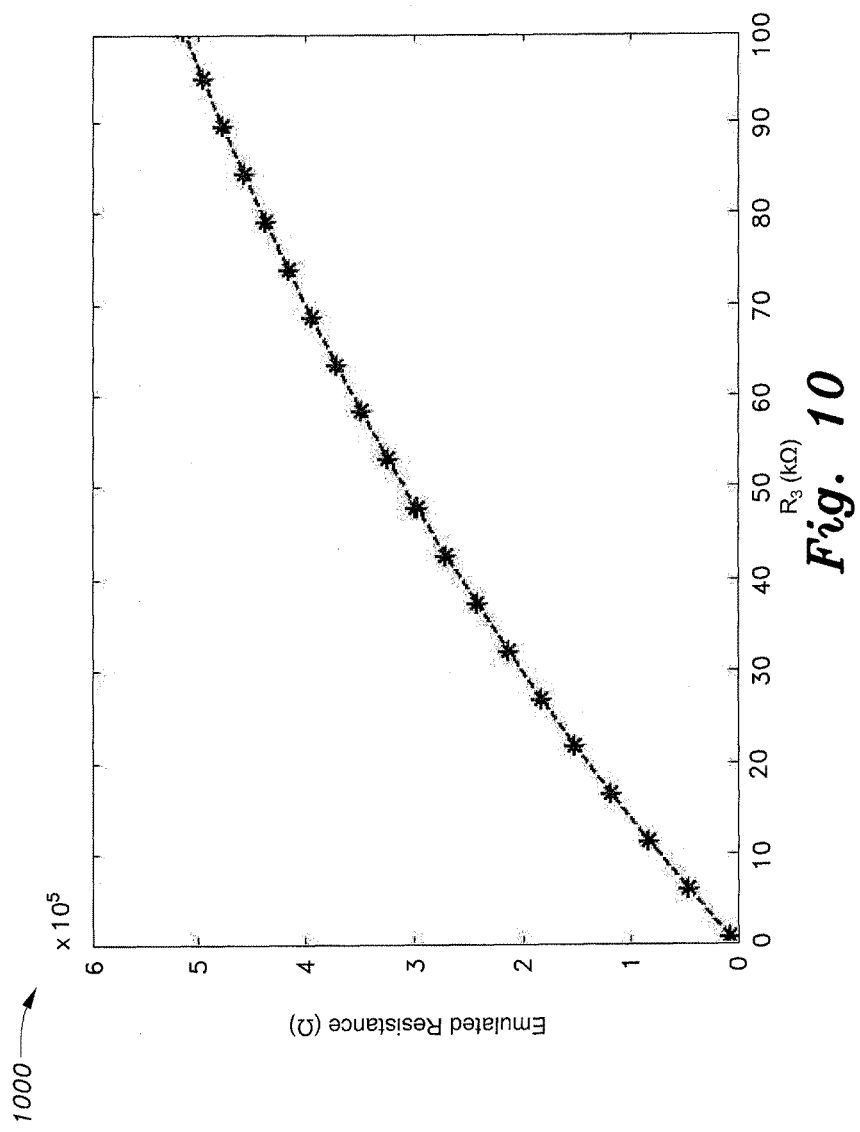
FIG. 10 is a plot showing variation of the resistance obtained using a resistance multiplier emulated using the immittance emulator of FIG. 1C.

The proposed circuit 100c of FIG. 1C was also tested as a resistance multiplier by connecting it in the test bench circuit of FIG. 2 with $Z_i$ and $Z_o$ formed of resistances $R_i$=$R_o$=1.0 kΩ, and with the values of the components of circuit 100c in FIG. 1C selected as $R_1$=1.0 kΩ, $R_2$=1.0 kΩ, and $R_3$ as a variable in the range 1.0 kΩ-500.0 kΩ. The value of the emulated resistance was monitored, and the results are shown in plot 1000 of FIG. 10. Inspection of FIG. 10 clearly shows that a resistance multiplication by a factor of 500 can be achieved. However, the multiplication factor is not linearly increasing with the value of $R_3$ for values of $R_3$>100.0 kΩ. This may be attributed to the nonidealities of the CFOAs.

Figure 11:
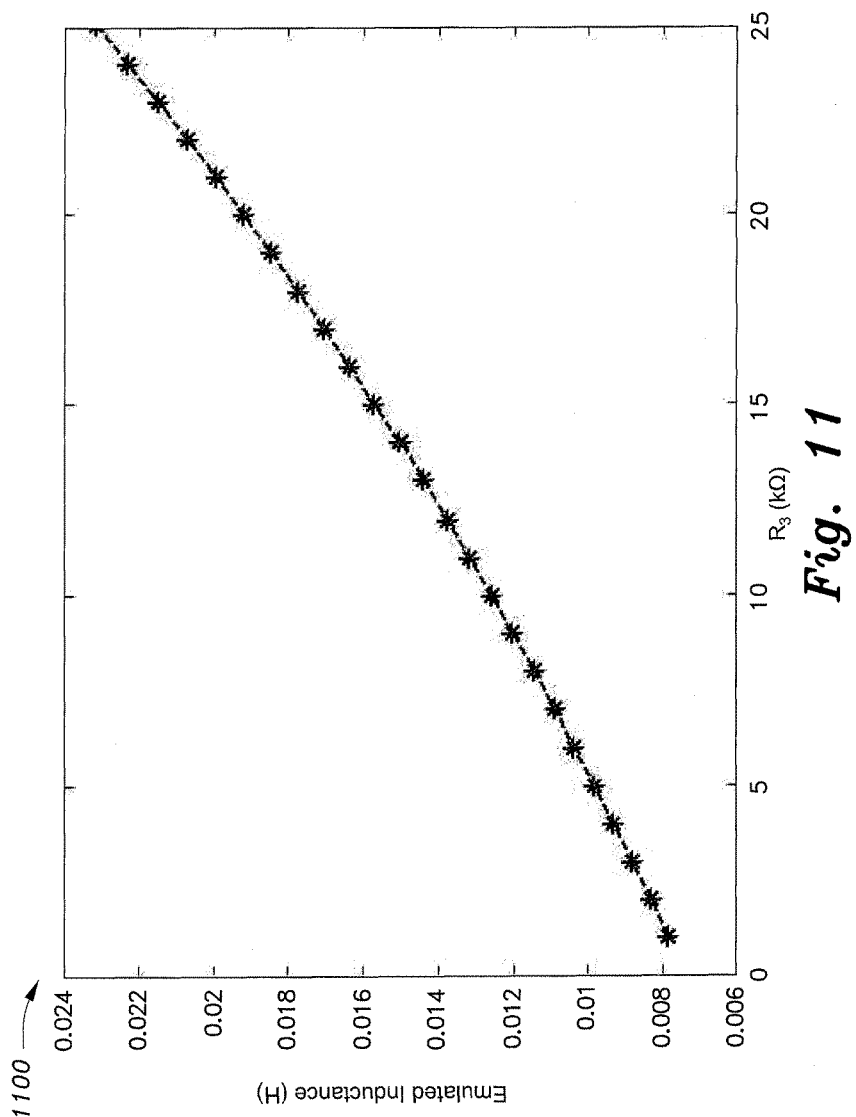
FIG. 11 is a plot showing variation of the inductance obtained using the inductance multiplier emulated using the immittance emulator of FIG. 1C. across a frequency-dependent negative-resistance emulated using the immittance emulator of FIG. 1C

The proposed circuit of FIG. 1C was also tested as an inductance multiplier by connecting it in the test bench circuit of FIG. 2 with $Z_i$ and $Z_o$ formed of resistances $R_i=R_o=1.0$ kΩ, and with the values of the components in FIG. 1C selected as $L_1=1.0$ mH, $R_2=1.0$ kΩ, and $R_3$ variable in the range 1.0 kΩ-25.0 kΩ. The value of the emulated inductance was monitored, and the results are shown in plot 1100 of FIG. 11. Inspection of FIG. 11 clearly shows that an inductance multiplication factor by 25.0 can be achieved.

Figure 12:
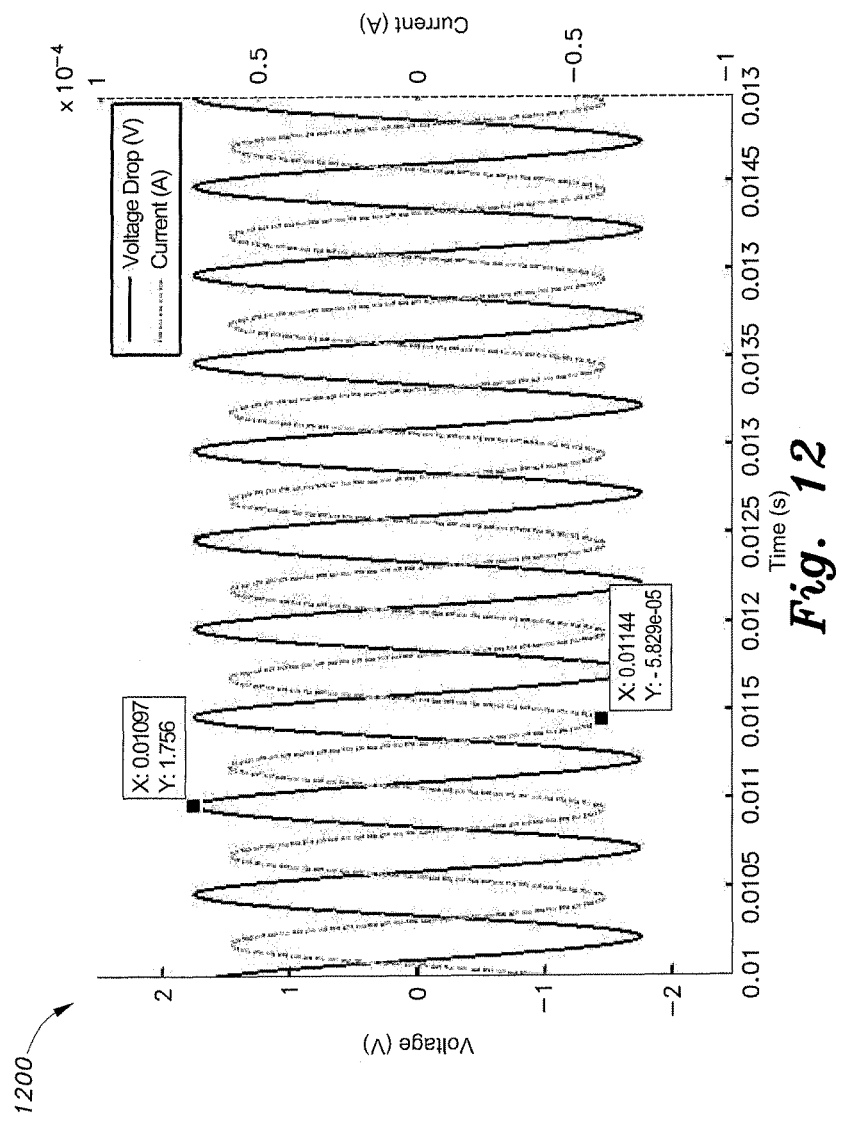
FIG. 12 is a plot showing waveforms of the current through and the voltage

The proposed circuit of FIG. 1C was also tested as a frequency-dependent negative-resistance by connecting it in the test bench circuit of FIG. 2 with $R_i=R_o=20.0$ kΩ, and with the values of the components in FIG. 1C selected as $R_1=1.0$ kΩ, $L_3=200.0$ mH and $C_2=1.0$ μF. The voltage across and the current through the emulated frequency-dependent negative-resistance were monitored, and the results are shown in plot 1200 of FIG. 12. Inspection of FIG. 12 clearly shows that the phase shift between the current and the voltage is 180°. This is a clear indication that the circuit is emulating a negative resistance. Moreover, at frequency=2 kHz, the calculated negative resistance is 31.55 kΩ, which is in excellent agreement with the simulated value of 29.956 kΩ.

Figure 13:
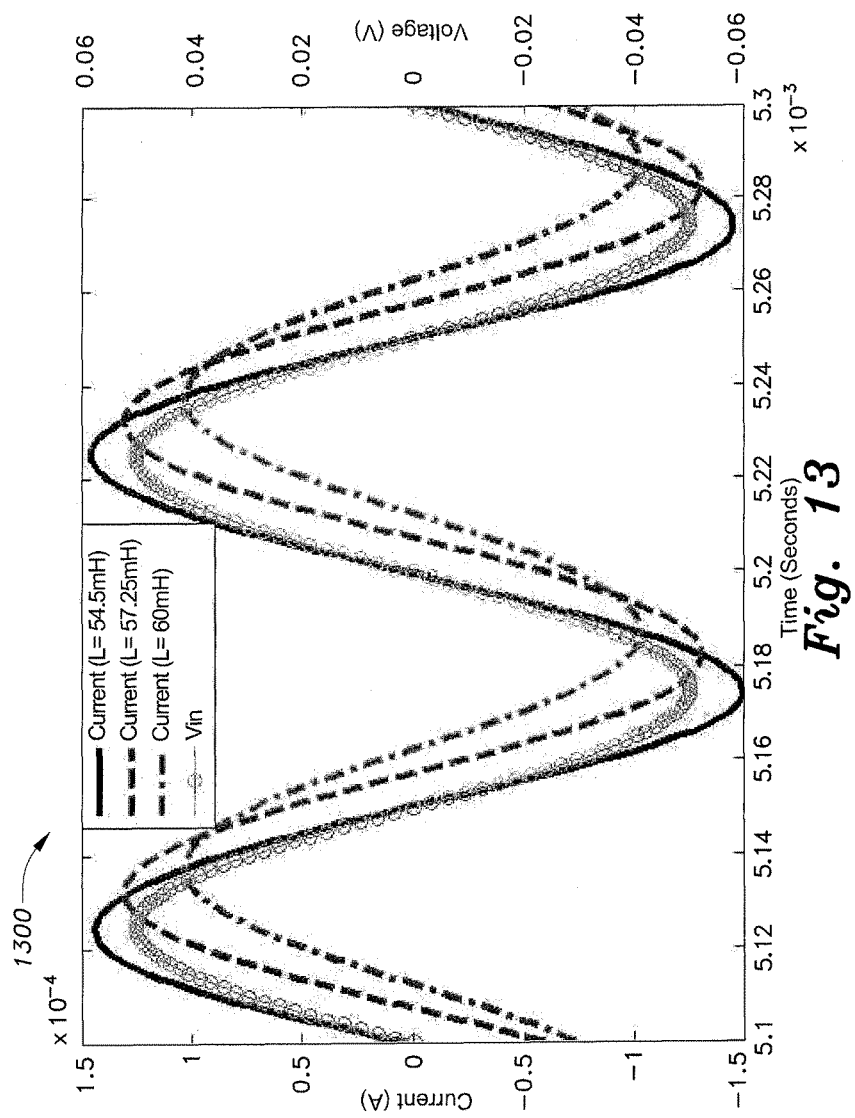
FIG. 13 is a plot showing waveforms of the current through and the input voltage of the circuit built using the negative inductance emulated using the immittance emulator of FIG. 1D Similar reference characters denote corresponding features consistently throughout the attached drawings.

The proposed negative lossless floating inductor obtainable from FIG. 1D was used in the test bench circuit of FIG. 2 with $Z_i$ formed of a variable positive inductance ($L_i$) and $Z_o$ formed of resistance ($R_o$). With the inductance $L_i$ varying in the range 54.5 mH-60.0 mH, and the resistance $R_o=500Ω$, and the values of the components in FIG. 1D selected as $R_1=1.0$ kΩ, $R_3=1.0$ kΩ and $C_2=50$ nF to emulate a lossless negative inductance=−50 mH, the applied input voltage and the resulting current though the circuit 200 of FIG. 2 were monitored. The results obtained are shown in plot 1300 of FIG. 13. Inspection of FIG. 13 clearly shows that the current through the circuit and the applied input voltage are in phase, indicating that the total impedance is purely resistive only when the externally connected inductance is equal to 54.5 mH. Otherwise, the current and the voltage are not in phase, indicating that the total impedance is inductive. This confirms that the proposed circuit of FIG. 1D emulates a negative inductance=−54.5 mH, with an error equal to 9.5% between the calculated and simulated values.

A catalog comprising four new circuits for emulating immittance functions has been presented. Each circuit uses three CFOAs and three passive elements. Using a test bench circuit, the proposed circuits were tested for realizing bandpass filters; capacitance, resistance, and inductance multipliers; and cancellation of positive inductances and resistances. The results show that bandpass filters working in the sub-Hz region are obtainable, and cancellation of positive inductances and resistances is feasible. The simulation results obtained are in excellent agreement with the calculations. The maximum error obtained is 9.5% for the case of emulating a negative inductance. For large values of a multiplying factor, in the case of resistance, capacitance and inductance multipliers, the multiplying factor exhibits a slight nonlinearity. This is attributed to the nonideal characteristics of the CFOAs. Moreover, the proposed emulators do not require any matching conditions.

It is to be understood that the present invention is not limited to the embodiments described above, but encompasses any and all embodiments within the scope of the following claims.

We claim:

1. A floating immittance emulator circuit, comprising:
   a first current feedback operational amplifier (CFOA) having first y-, x-, z-, and w-terminals;
   a second CFOA having second y-, x-, z-, and w-terminals, the second z-terminal of the second CFOA being connected to ground, and the second y-terminal of the second CFOA being connected to the first z-terminal of the first CFOA;
   a third CFOA having third y-, x-, z-, and w-terminals, the third z-terminal being connected to the first x-terminal of the first CFOA;
   a first impedance having a first lead connected to the first y-terminal of the first CFOA and a second lead connected to the third x-terminal of the third CFOA;
   a second impedance having a first lead connected to the third w-terminal of the third CFOA and a second lead connected to the third y-terminal of the third CFOA; and
   a third impedance having a first lead connected to the third y-terminal of the third CFOA and a second lead connected to the second x-terminal of the second CFOA;
   wherein the emulator circuit emulates immittance between a voltage $v_1$ applied to the first y-terminal of the first CFOA and a voltage $v_2$ applied to the second y-terminal of the second CFOA.

2. The floating immittance emulator according to claim 1, wherein the first, second and third impedances comprise a resistance $R_1$, a capacitive reactance, $$\frac{1}{sC_2},$$

and a resistance $R_3$, respectively, the emulator simulating a lossy inductance with a series-connected resistance with $R_{eq}=R_1$, $L_{eq}=C_2R_1R_3$.

3. The floating immittance emulator according to claim 2, further comprising:
   a first external impedance connected in series with an input of the immittance emulator; and
   a second external impedance connected between an output of the immittance emulator and ground;
   wherein a circuit formed by the first and second external impedances in combination with the immittance emulator defines a transfer function characterizing a bandpass filter having a variable Q and center frequency.

* * * * *